United States Patent [19]

Harper et al.

[11] 4,369,269

[45] Jan. 18, 1983

[54] CONDUCTIVE INK

[75] Inventors: William P. Harper, Phoenix; Michael J. Taylor, Mesa, both of Ariz.

[73] Assignee: Rogers Corporation, Rogers, Conn.

[21] Appl. No.: 156,670

[22] Filed: Jun. 5, 1980

[51] Int. Cl.$^3$ .................. C08L 75/04; C08L 63/00
[52] U.S. Cl. .............................. 523/459; 524/439; 524/539; 524/590; 524/601; 524/602
[58] Field of Search ............... 260/40 TN, DIG. 38, 260/37 EP, 40 R; 106/20; 523/459; 524/439, 590, 601, 602, 539

[56]     References Cited
U.S. PATENT DOCUMENTS

| | | | |
|---|---|---|---|
| 2,823,146 | 2/1958 | Roberts et al. | 106/20 |
| 3,015,632 | 1/1962 | Remer | 106/20 |
| 3,025,160 | 3/1962 | Bunge et al. | 260/40 TN |
| 3,479,325 | 11/1969 | Blomeyer et al. | 106/20 |
| 4,157,947 | 6/1979 | Borden et al. | 260/40 TN |

*Primary Examiner*—Theodore E. Pertilla
*Attorney, Agent, or Firm*—David S. Fishman

[57]     ABSTRACT

An improved method of manufacturing electrical and electronic circuits is provided wherein an improved conductive ink is employed to define the pathways of current flow. This improved conductive ink is comprised of conductive particles, thermosetting binder and a multifunctional isocyanate. The isocyanate provides cross-linking between the conductive ink binder and the surface upon which the ink is applied and establishes a bond with enhanced moisture durability.

18 Claims, No Drawings

CONDUCTIVE INK

BACKGROUND OF THE INVENTION (1) Field of the Invention

The present invention relates to the manufacture of electrical and electronic circuits and particularly to the fabrication of printed circuits. More specifically, this invention is directed to conductive ink which may be employed to define paths for current flow between components of an electrical or electronic device. Accordingly, the general objects of the present invention are to provide novel and improved methods and materials of such character.

(2) Description of the Prior Art

Conductive inks are well known in the art. The typical conductive-silver-ink formulation contains a thermosetting binder which serves as a carrier for the silver particles. The binder may, for example, comprise an epoxy/urethane mixture. The conductive ink is applied to a nonconductive substrate by any suitable technique, to establish a current path or paths between components of an electrical or an electronic device, and the binder is thereafter cured by the application of heat.

The conductive inks disclosed in the prior art exhibit characteristics which make their use under certain conditions disadvantageous. Some devices, such as conductors, in which the conductive pathway is defined by a conductive ink, must be capable of withstanding "super soak" conditions, ninety-six hours at 95% relative humidity and 65° Celsius, without degradation. Prior art conductive inks exhibit poor moisture durability. The bond between these inks and the various nonconductive substrates over which they are applied, to form a conductive pathway, is known to degrade under "super soak" conditions.

The prior art also discloses the use of conductive inks along with a circuit which has been etched from a copper to nonconductive substrate laminate. Here the laminate has undergone various wet processing manufacturing steps such as etching and stripping operations. Because of these manufacturing steps the now exposed cured adhesive which had been used to bond the copper to the substrate has been subjected to chemical attack. Application of prior art conductive ink has shown poor adhesion to the old chemically attacked adhesive.

SUMMARY OF THE INVENTION

The present invention overcomes the above-discussed disadvantages and other deficiencies of the prior art by providing a novel and improved conductive ink. A conductive ink in accordance with the present invention is characterized by the establishment of a bond with the substrate, to which it has been applied, which has enhanced moisture durability. Also, a conductive ink in accordance with the present invention is characterized by establishment of an improved bond to an exposed cured adhesive layer, on a nonconductive substrate, which has been subjected to chemical attack.

In accordance with the present invention, a low molecular weight multifunctional isocyanate, preferably a difunctional isocyanate, is added to the binder material of a conductive ink. In accordance with the preferred embodiment, toluene diisocyanate or isophorone diisocyanate is used. The multifunctional isocyante is added in quantities which comprise less than 10% by weight of the binder. The isocyanate employed, in accordance with the present invention, is characterized by an isocyanate to hydroxyl ratio, which is a function of the composition of the binder, in the range of 0.01:1 to 1.5:1.

DESCRIPTION OF THE PREFERRED EMBODIMENT

A conductive ink in accordance with the present invention will comprise a binder, in the form of a thermosetting adhesive, electrically conductive particles, for example, silver, and a multifunctional isocyanate having a low molecular weight. In formation of the ink, the isocyanate will typically be added to a previously prepared conductive ink with the amount added, as a percent by weight of the binder, being a function of the characteristics of the binder.

In one preferred embodiment of the present invention, isophorone diisocyanate, having a molecular weight of 222, was dissolved in a screening solvent, butyl cellosolve acetate, with the isophorone diisocyanate being in a concentration of 10% by volume of the solution. This solution was then added to a commercially available conductive ink, comprised of silver particles and an epoxy/urethane binder. This commercially available conductive ink is sold under the name Uniset 927-13 by Amicon Corporation, 25 Hartwell Ave., Lexington, Mass. 02173.

Three testing samples of the above composition were prepared with the isophorone diisocyanate to binder weight ratios of 3:100, 5:100 and 10:100 respectively. These testing samples and a control sample of the conductive ink were applied to a testing surface. This surface comprised a nonconductive substrate which had been previously bonded to copper and was subsequently etched clean. The above samples were applied over this previously cured adhesive surface in the form of a thixotropic paste by screen printing.

The testing surface along with the four screen printed samples of conductive ink were subjected to "super soak" conditions to determine at what point in time there was a failure of bond integrity, per a standard I.P.C. tape test. The following are the results of the test: the control sample with 0% isophorone diisocyanate failed at two hours; the sample with 3% by weight of the isophorone diisocyanate failed at 6 hours; the sample with 5% by weight of the isophorone diisocyanate failed after 64 hours; and the 10% by weight of isophorone diisocyanate had not failed at the termination of the standard 96 hour test. All four samples retained their functional flexibility, scratch resistance and electrical conductivity prior to experiencing bond failure. A further test with the same test results was run substituting tolylene diisocyanate, with a molecular weight of 174.16, for isophorone diisocyanate.

It is theorized that by adding an excess of the isocyanate a nonequilibrium of active hydroxyl sites is created. The isocyanate in the conductive ink binder would then migrate to the surface of the substrate and cross-link the old cured adhesive surface with the thermosetting binder. It is further theorized, that the reactivity differential between the isocyanate groups on the isophorone diisocyanate results in one group only reacting with the cured adhesive layer and the other only reacting with the adhesive binder, thus cross-linking the two. These theories are neither confirmed nor suggested as the only theories and should not be taken in any manner to limit the scope of the present invention.

It has been found that the present invention may comprise, depending on processing conditions and with particular interest in preventing toxic vapors a multifunctional or difunctional isocyanate, either monomeric aliphatic or aromatic, with a molecular weight ranging from 150–350 and having low vapor pressure relative to other low molecular weight isocyanates at standard temperature and pressure. Furthermore, preferred ratio of isocyanate to hydroxyl sites is 0.01:1 to 1.5:1. The following is a partial list of multifunctional isocyanates that may be employed with the present invention: toluene diisocyanate, hexamethylene diisocyanate, triphenylmethane-p, p', p'''-triisocyanate, diphenylmethane-p, p' diisocyanate, dianisidine diisocyanate, thiophosphoric acid tris (p-isocyanatophenyl ester) and trimethyl-hexamethylene diisocyanate.

The above isocyanates may be added to any conductive ink wherein the binder is an epoxy, urethane, polyester, or adduct or combinations of these materials. The cured adhesive layer may also be one of the above compounds or compositions. These adhesive systems are characterized as easily hydrolyzed and thus are subject to chemical attack after wet processing or if subject to high humidity conditions and will lose bond integrity as a result. Any binder having hydroxyl functionality or the ability to form hydroxyl groups may be used in the present invention.

While the preferred embodiments have been shown and described, various substitutions and modifications may be made thereto without departing from the spirit and scope of the invention. Accordingly, it is to be understood that the present invention has been described by way of illustration and not limitation.

What is claimed is:

1. An improved conductive ink for application to a previously hydrolyzed polymer surface comprising:
    a thermosetting binder which is characterized as having hydroxyl functionality and the ability to form hydroxyl groups;
    conductive particles; and
    3 to 10% by weight of the binder of a multi-functional isocyanate, said isocyanate being characterized by the ability to migrate to the previously hydrolized polymer surface from the binder, said isocyanate reacting with the hydroxyl groups of the hydrolized polymer surface and the hydroxyl groups of the binder so as to cross-link the binder and the hydrolized polymer surface, said isocyanate having a molecular weight ranging between 150 and 350 and a low vapor pressure relative to other isocyanates which have a molecular weight ranging between 150 and 350.

2. The improved conductive ink of claim 1 wherein the multifunctional isocyanate is a diisocyanate.

3. The improved conductive ink of claim 2 wherein the isocyanate is isophorone diisocyanate.

4. The improved conductive ink of claim 2 wherein the isocyanate is tolylene diisocyanate.

5. The improved conductive ink of claim 1 wherein the isocyanate is selected from the group consisting of: hexamethylene diisocyanate, triphenylmethane-p, p', p'''-triisocyanate, diphenylmethane-p, p' diisocyanate, dianisidine diisocyanate, thiophosphoric acid tris (p-isocyanatophenyl ester) and trimethyl-hexamethylene diisocyanate.

6. The improved conductive ink of claim 5 wherein the thermosetting binder is selected from the group consisting of:
    epoxide, polyester, urethane and adducts and combinations of the above.

7. The improved conductive ink of claim 1 wherein the isocyanate-hydroxyl ratio is between 0.01:1 to 1.5:1.

8. A method of enhancing the bond between a conductively filled thermosetting binder and a previously hydrolyzed polymer surface comprising the following steps:
    selecting a conductively filled thermosetting binder characterized as having hydroxyl functionality and the ability to form hydroxyl groups;
    adding to the binder from 3% to 10% by weight of the binder of a multifunctional isocyanate which is characterized by being able to migrate to the previously hydrolyzed polymer surface from the conductively filled thermosetting binder, the isocyanate having a molecular weight ranging between 150 and 350;
    applying the isocyanate containing conductively filled thermosetting binder to the previously hydrolyzed polymer surface; and
    allowing the isocyanate containing conductively filled thermosetting binder to set.

9. The method of claim 8 further including the step of selecting the multi-functional isocyanate from the group consisting of:
    isophorone diisocyanate, toluene diisocyanate, hexamethylene diisocyanate, triphenylmethane-p, p', P'''-triisocyanate, diphenylmethane-p, p' diisocyanate, dianisidine diisocyanate, thiophosphoric acid tris (p-iso-cyanatophenyl ester) and trimethyl-hexamethylene diisocyanate.

10. The method of claim 8 further including the step of selecting the thermosetting binder from the group consisting of:
    epoxies, polyesters, urethanes and adducts and combinations of the above.

11. An improved conductive ink for application to a previously hydrolyzed polymer surface comprising:
    a thermosetting binder selected from the group consisting of epoxy, urethane and polyester materials and adducts and combinations thereof and which is characterized as having hydroxyl functionality and the ability to form hydroxyl groups;
    metallic conductive particles; and
    3% to 10% by weight of the binder being a multifunctional isocyanate, said isocyanate being characterized by the ability to migrate to the previously hydrolyzed polymer surface from the binder, said isocyanate reacting with the hydroxyl groups of the hydrolyzed polymer surface and the hydroxyl groups of the binder so as to cross-link the binder and the hydrolyzed polymer surface, said isocyanate having a molecular weight ranging between 150 and 350 and a low vapor pressure relative to other isocyanates which have a molecular weight ranging between 150 and 350.

12. A method of enhancing the bond between a conductively filled thermosetting binder and a previously hydrolyzed polymer surface comprising the following steps:
    selecting a conductively filled thermosetting binder from the group consisting of epoxy, urethane and polyester materials and adducts and combinations thereof and which is characterized as having hydroxyl functionality and the ability to form hydroxyl groups;
    adding to the binder from 3% to 10% by weight of the binder of a multi-functional isocyanate which is characterized by being able to migrate to the previously hydrolyzed polymer surface from the conductively filled thermosetting binder, the isocyanate having a molecular weight ranging between 150 and 350;

applying the isocyanate containing conductively filled thermosetting binder to the previously hydrolyzed polymer surface; and allowing the isocyanate containing conductively filled thermosetting binder to set.

13. The method of claim 12 further including the step of selecting the multi-functional isocyanate from the group consisting of:

isophorone diisocyanate, toluene diisocyanate, hexamethylene diisocyanate, triphenylmethan-p,p′, P‴-triisocyanate, diphenylmethane-p, p′ diisocyanate, dianisidine diisocyanate, thiophosphoric acid tris (p-iso-cyanatophenyl ester) and trimethyl-hexamethylene diisocyanate.

14. The improved conductive ink of claim 11 wherein the multi-functional isocyanate is a diisocyanate.

15. The improved conductive ink of claim 14 wherein the isocyanate is isophorone diisocyanate.

16. The improved conductive ink of claim 14 wherein the isocyanate is tolylene diisocyanate.

17. The improved conductive ink of claim 11 wherein the isocyanate is selected from the group consisting of:

isophorone diisocyanate, toluene diisocyanate, hexamethylene diisocyanate, triphenylmethan-p,p′, P‴-triisocyanate, diphenylmethane-p, p′ diisocyanate, dianisidine diisocyanate, thiophosphoric acid tris (p-iso-cyanatophenyl ester) and trimethyl-hexamethylene diisocyanate.

18. The improved conductive ink of claim 11 wherein the isocyanate-hydroxyl ratio is between 0.01:1 to 1.5:1.

* * * * *